United States Patent [19]

Hosokawa et al.

[11] Patent Number: 5,081,072
[45] Date of Patent: Jan. 14, 1992

[54] MANUFACTURING METHOD OF SUPERCONDUCTING MATERIAL AND PRODUCT AND SUPERCONDUCTING MATERIAL

[75] Inventors: Masuo Hosokawa, Toyonaka; Tohei Yokoyama, Kuse; Makio Naito; Masahiro Yoshikawa, both of Hirakata, all of Japan

[73] Assignee: Hosokawa Micron Corporation, Osaka, Japan

[21] Appl. No.: 582,811

[22] Filed: Sep. 12, 1990

Related U.S. Application Data

[63] Continuation of Ser. No. 344,930, Apr. 28, 1989, abandoned.

[30] Foreign Application Priority Data

Jul. 7, 1988 [JP] Japan .................................. 63-169475
Jul. 8, 1988 [JP] Japan .................................. 63-171500
Aug. 23, 1988 [JP] Japan .................................. 63-208676

[51] Int. Cl.⁵ ............................................. H01L 39/24
[52] U.S. Cl. .................................... 505/1; 29/599; 241/3; 241/23; 241/29; 241/101.B
[58] Field of Search ............... 241/101 B, 107, 108, 241/110, 111, 112, 117, 118, 199.7, 3, 23, 27, 29, 30; 29/599; 505/1

[56] References Cited

U.S. PATENT DOCUMENTS

| | | |
|---|---|---|
| 513,197 | 1/1894 | Pamphilon .................. 241/107 X |
| 1,426,118 | 8/1922 | Sonsthagen .................. 241/110 X |
| 2,210,467 | 8/1940 | Smith ......................... 241/117 |
| 2,524,884 | 10/1950 | Clerk ........................ 241/107 X |
| 2,578,180 | 12/1951 | Edwards ..................... 241/107 X |
| 2,589,917 | 3/1952 | Zückert ..................... 241/107 |

FOREIGN PATENT DOCUMENTS

| | | |
|---|---|---|
| 1060569 | 4/1954 | France ....................... 241/118 |
| 264324 | 1/1927 | United Kingdom .......... 241/131 |

Primary Examiner—Joseph M. Gorski
Attorney, Agent, or Firm—Edwin E. Greigg; Ronald E. Greigg

[57] ABSTRACT

A manufacturing method of a superconducting material having the steps of: milling and mixing a powderly primary material in a casing of a dry type milling mixer; heat-processing the primary material obtained from the milling/mixing step; and again milling and mixing the primary material obtained from the heat-processing step in the casing of the milling mixer so as to obtain a secondary material. The milling mixer includes a casing for holding the primary material therein and friction-pulverizing mixing elements for frictionally pulverizing, stirring and mixing the primary material inside the casing. The two milling/mixing steps are effected under a high-speed rotation of the casing where a centrifugal force resulting from the casing rotation presses the primary material against an inner surface of the casing and a layer of the material formed on the surface is frictionally pulverized, stirred and mixed by the friction-pulverizing mixture elements.

12 Claims, 8 Drawing Sheets

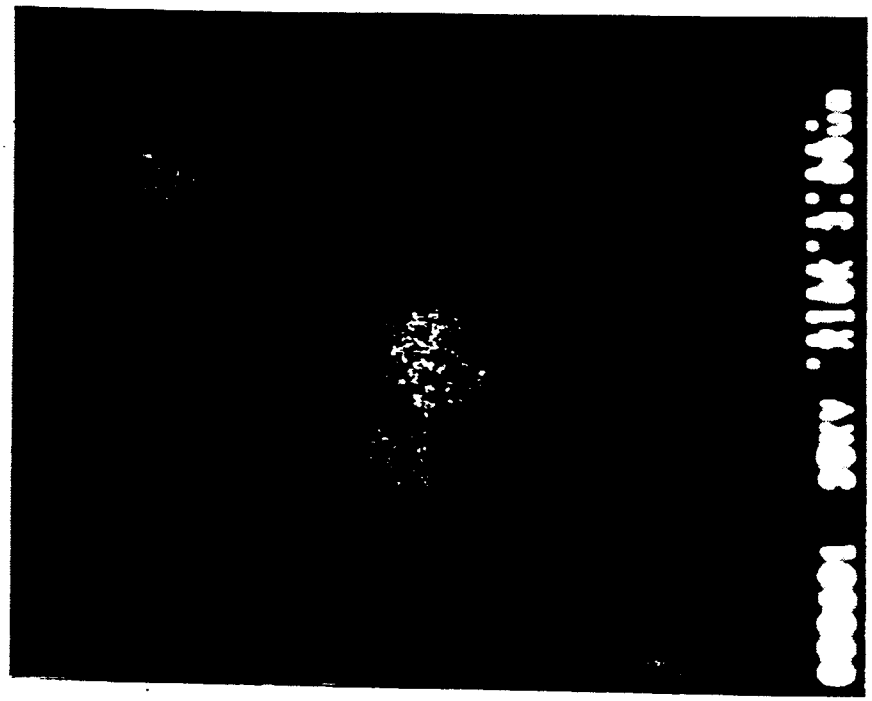
Fig.11(c) Ba
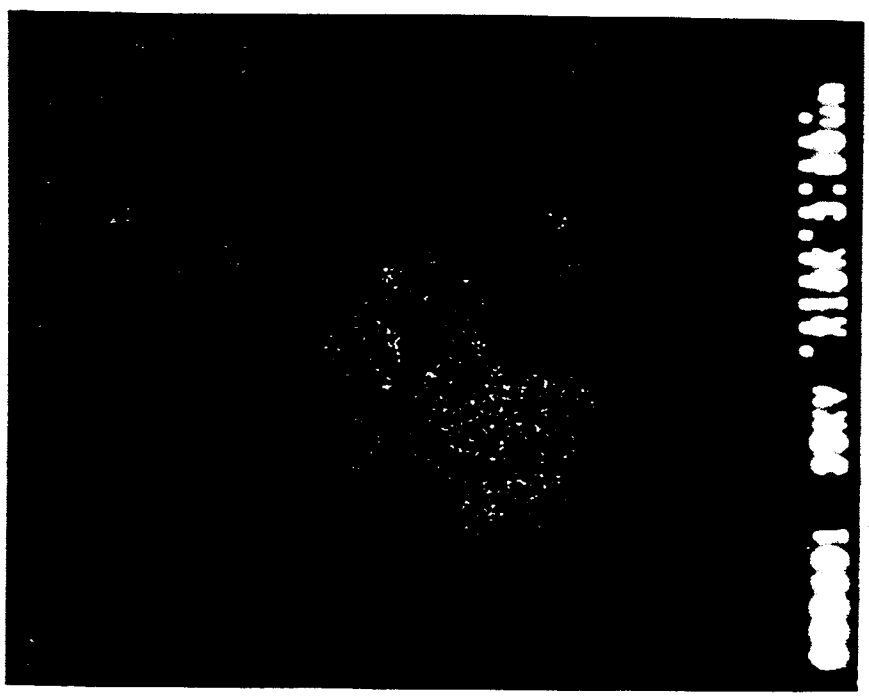
Fig.11(d) Cu

MANUFACTURING METHOD OF SUPERCONDUCTING MATERIAL AND PRODUCT AND SUPERCONDUCTING MATERIAL

This is a continuation of copending application Ser. No. 07/344,930 filed on Apr. 28, 1989, now abandoned.

BACKGROUND OF THE INVENTION

1. Field of the Invention

The present invention relates to a manufacturing method of manufacturing methods of superconducting material and product and superconducting material.

2. Description of the Prior Art

In manufacturing superconducting material or product, there have been generally employed methods to be specifically described next.

In a first manufacturing process P1, a fine powderly primary material m1, as a raw material of superconducting material, is primarily milled and mixed at a dry type milling mixer at step S1. Next, at step S2, the milled primary material m1 obtained from the step S1 is heat-processed. Then, at step S3, the heat-processed material from the step S2 undergoes a secondary milling/mixing process to become a secondary material m2.

In a second process P2 for obtaining a superconducting material M1, after the above process P1, the secondary material m2 is molded at step S4 and then baked at step S5.

In a third process P3 for obtaining a superconducting wire product M2, the secondary material m2 from the process P1 is filled into a pipe at step S6. Then, this pipe undergoes a wire drawing process at step S7, and the secondary material m2 in the wire-drawn pipe is sintered at step S8.

In a fourth process P4 for obtaining a powderly target material M3 for forming a superconducting thin film, the secondary material m2 from the process P1 is molded at step S4 and then baked at step S5.

According to the prior art, in order to obtain a superconducting product or a superconducting wire product, a dry type milling/mixer such as shown in FIG. 12. This milling/mixer includes a casing 35 which is maintained still or rotated at a slow speed in operation and milling elements 36 disposed inside the casing 35 and rotated at a slow speed about an axis P. In operation, the primary material m1 is milled between the bottom surface of the casing 35 and the milling elements 36, and at the same time, with the rotation of the milling elements 36, the material m1 is stirred and mixed, whereby the primary milling/mixing process S1 and the secondary milling/mixing process S3 are effected.

Further, the heat-processing step S2 and the secondary milling/mixing step S3 are repeated no less than 3 to 4 times, thereby causing a preliminary solid phase reaction and eliminating gaseous matters and impurities at the heat-processing steps S2 and effecting milling and particle-size-averaging operations at the secondary milling/mixing step S3.

With the above-described conventional milling/mixer; however, the milling of the primary material m1 is effected only by pressing the same against the bottom surface of the casing 35 by means of the milling elements 36, whereby the particle size distribution efficiency is extremely low. With such low efficiency, the heat-processing step S2 and the primary and secondary milling/mixing steps S1 and S3 need to be repeated for three to four times, and even after the repetition of these steps, a superconducting material or product obtained from this processed secondary material achieves only low performance. In short, the above conventional milling/mixer has suffered from high running costs and time-consuming and troblesome operations. Moreover, with the secondary milling/mixing step S3 using the conventional device, there occurs a great amount of irregularity in the particle size. Accordingly, if the secondary material m2 with such particle size irregularity is filled in the pipe at step S6, there tends to occur a great number of voids in the material filled in the pipe, which results in disadvantageous unevenness in the concentration of the material m2 in the wire drawing operation subsequently effected at step S7. Needless to say, such uneven material concentration easily leads to deterioration in the electric current density when the material is sintered at step S8.

On the other hand, for manufacturing a target material for forming a superconducting thin film, the prior art has used a dry type milling/mixer such as shown in FIG. 13. This milling/mixer is essentially a ball mill having a drum type casing 38 to be slowly rotated about a horizontal axis and a plurality of balls 37 freely movably held in the casing 38. In operation, with a rotation of the casing 38, the primary material m1 is stirred and milled between the balls 37 each other or between the balls 37 and the casing 38, thereby effecting the primary milling/mixing step S1 and the secondary milling/mixing step S3.

However, the primary and second milling/mixing steps S1 and S3 using the above-described ball mill are very inefficient and therefore very time-consuming. Moreover, because of the inefficient and insufficient mixing effect, the obtained target material often fails to satisfy the requirement of extremely even particle size distribution and concentration for forming a high-quality superconducting film.

The first object of the present invention is to provide an improved manufacturing method of a secondary material for a high-quality superconducting product or wire product having a sufficiently high electric current density or for a target material for forming a high-quality superconducting film.

Again, according to the prior art, the fine powderly secondary material m2 obtained from the secondary milling/mixing steps S3 was not coated. However, such un-coated secondary material m2, if stored for a long period, often shows a quality deterioration due to oxygen or moisture existing in the ambient air.

With view to this problem, the second object of the present invention is to provide an improved fine powderly secondary material m2 of a superconducting material which may effectively resist such quality deterioration due the oxygen or moisture in the ambience through an extended storage period.

Further, in the prior art of obtaining a superconducting mold product, the secondary material m2 after the secondary milling/mixing steps S3 is mixed with such a binder as PVA and then this mixture is baked at step S5. However, since a sintering process takes place after molding with the binder the secondary material m2 which has been only baked, the sintering process often accompanies significant thermal contraction or distortion, which makes it difficult to control the shape or size of the superconducting product with high precision. Consequently, if the superconducting product is to acquire a complicated shape which requires such high manufacturing precision, the prior art has been unable to produce such products on a mass-production scale.

Thus, the third object of the present invention is to provide a manufacturing method which makes it possible to easily produce a superconducting product even if the product is to acquire a complicated shape.

In the prior art of obtaining a superconducting wire product, in the sintering process of step S8, the pipe is made from Ag in order to avoid any undesired reactions between the secondary material m2 and the pipe. Also, if the material m2 contains Y, $O_2$ is fed into the pipe over a long period so that the fed $O_2$ diffuse inside the pipe to effectively maintain the rhombic system of the material components. Naturally; however, Ag pipe is very costly and moreover, the pipe of such good conductor as Ag prohibits its use with an alternating current system. Moreover, the feeding of the $O_2$ into the pipe of small diameter is extremely difficult.

In view of the above state of the art, the fourth object of the present invention is provide a manufacturing method of superconducting wire product, which method permits formation of pipe with inexpensive and non-conductive material and which eliminates the necessity of feeding of O into the pipe.

SUMMARY OF THE INVENTION

In order to accomplish the above-described objects, according to a first characterizing feature of the present invention, a manufacturing method of a superconducting material comprising the steps of: a primary milling/mixing step of milling and mixing a powderly primary material in a casing of a dry type milling mixer; a heat-processing step of heat-processing the primary material obtained from the primary milling/mixing step; and a secondary milling/mixing step of milling and mixing the primary material obtained from the heat-processing step in the casing of the milling mixer so as to obtain a secondary material; wherein the milling mixer includes a casing for holding the primary material therein and friction-pulverizing mixing means for frictionally pulverizing, stirring and mixing the primary material inside the casing, and wherein the primary milling/mixing step and secondary milling/mixing step are effected under a high-speed rotation of the casing where a centrifugal force resulting from the casing rotation presses the primary material against an inner surface of the casing and a layer of the material formed on the surface is frictionally pulverized, stirred and mixed by the friction-pulverizing mixing means.

With the above first characterizing feature of the present invention, when the casing is driven to rotate at a high speed, the resultant centrifugal force strongly presses the primary material against the inner casing surface, thereby forming a layer of the material on the surface. Then, the pulverization is effected on this material layer which movement is significantly limited by said force. Accordingly, the pulverization may be effected very efficiently and reliably and therefore in a short time. Further, since the pulverization and mixing are effected simultaneously, the material may be finely and evenly pulverized in a short time and mixed and distributed evenly.

Moreover, if the pulverization and mixing are effected on the material layer under such strong pressing force, the mixture in the primary material occurs not only in the particle level but also in the super fine particle level. More specifically, since the pulverized particles of the primary material strongly pressed against the inner casing surface is subjected to a strong compressing and severing forces, the surface of the pulverized material is highly activated to allow evenly mixed different kinds of super fine particles in the micron or sub-micron order to bond firmly to each other. Also, since the different kinds of super fine material particles are strongly compressed with each other thereby increasing the contact surface areas between the particles, the bonding of the particles takes place very efficiently. Moreover, at the boundary across which the particles are bonded, there occurs a solid phase reaction, i.e. chemical molecular bonding between the particles due to diffusion of the different particle components. Such interaction between a mechanical force and a physiochemical property change is generally referred to as a mechanochemical phenomenon. Then, a mechanofusion will be defined hereinafter as a surface fusion between particles of different properties caused by the mechanochemical phenomenon due to strong mechanical energy exerted by frictional pulverization and mixing by the pulverizing mixer. In the super fine particles firmly bonded by the mechanofusion effect, during a heat processing, the solid phase reaction between components of respective bonded particles may be highly promoted thereby effectively diffusing the components. Also, in a sintering process conducted after the secondary milling/mixing process, the components may be further diffused efficiently. Consequently, according to the method of the present invention, it becomes possible to achieve an improved secondary material having sufficiently fine particles of regular size and even composition and with portion of respective components being effectively diffused. And, when this secondary material is used for manufacturing a superconducting mold product or target material for use in sputtering, the product or the film formed by the target material may achieve superior superconducting performance.

Especially, with the above-described method of the invention, the heating and secondary milling/mixing steps, which has been repeated for three to four times in the prior art, may be reduced to one time, whereby the manufacturing costs, time and labor may be significantly reduced in comparison with the prior methods.

Further, in checking the current density of the superconducting material product obtained by molding and sintering the secondary material after the secondary milling/mixing process, the results show that the product of the invention provides a much higher current density than the prior products. This is because the method of the invention provides sufficiently minute material particles which may be densely, i.e. without voids, packed in the mold. Next, an experiment was conducted to see the relationship between the temperature of the superconductor obtained by the above first characterizing method of the invention and its electric resistance, which experiment result is shown in FIG. 10. As shown, the superconductor achieves superior property of sufficiently large change ratio in the electric resistance both in a high temperature range A and in a low temperature range B. Note especially that the critical temperature of the superconducting property is higher than the prior products in spite of the reduced processing period.

Further, in the secondary milling/mixing step, the super fine particles are firmly bonded to each other to form a composite particle, whereby the materials may be granulated in the order of a few $\mu$ms to a few tens of $\mu$ms. Through this granulation, the obtained particles acquire even particle size distribution which leads to a good fluidity of the material. Then, the good fluidity results in a higher density and even composition distribution of the material when the same is filled in the pipe. Further, the bonding between the super fine particles is so strong as to effectively resist change in the composition array which would otherwise occur in the course of wire drawing operation, whereby the wire drawing operation of this pipe may be carried out easily and reliably without significantly disturbing the particle structure obtained in the previous step, and the density of the material in the pipe may be effectively increased and averaged. As the result, with the method of the present invention, it has become possible to provide a high-quality and inexpensive superconducting product such as a superconducting wire product with an increased electric current density.

Preferably, according to a second characterizing feature of the invention, the friction pulverizing mixing means includes; a friction-pulverizing element for frictionally pulverizing the material layer through relative movement thereof with respect to the casing, and a scraping element for stirring and mixing the material layer through relative movement thereof with respect to the casing.

With the above-described second characterizing feature of the invention, as the high-speed rotation of the casing moves the friction-pulverizing element relative to the primary material layer pressed against the inner casing surface, the material may be forcefully and reliably pulverized. In addition, simultaneously therewith, since the scraping element reliably and sufficiently stirrs and mixes the fine powderly primary material through its movement relative to the material layer. When these effects combined, it has become possible to improve the efficiencies of the pulverization and stirring/mixing of the primary material.

Still preferably, according to a third characterizing feature of the invention, the friction-pulverizing element and the scraping element effect relative rotation with respect to the casing. With this feature, by effectively utilizing the high speed rotation casing, the relative moving speed may be readily increased for improving the efficiency of frictional pulverization, mixing and diffusion of the primary material. As the result, it becomes possible to work the invention at even lower running costs.

According to a fourth characterizing feature of the invention, the core particles of the superconducting material are coated with a coating material.

With this feature, the core particles of the superconducting material may be substantially free from contact with the atmosphere by the existance of the coating material. Consequently, it becomes possible to effectively restrict quality deterioration in the core particles of the superconducting material due to oxygen or moisture in the atmosphere, whereby the superconducting material may be stored under a good condition for an extended period of time.

According to a fifth characterizing feature of the invention, the method comprising the steps of: sintering a fine powderly secondary material to obtain core particles; coating the core particles with a coating material to obtain a fine powderly tertiary material; filling the tertiary material into a mold; heating the mold filled with the tertiary material to heat-fuse the coating material; and cooling the tertiary material in the mold to allow the coating material to harden thereby producting a superconducting mold product.

With the above method of the fifth characterizing feature of the invention, the fine powderly secondary material particles are sintered prior to the molding operation. Thus, the obtained core particles are sufficiently contracted by the heat. Accordingly, it has become possible to readily maintain high precision of the shape and size of the superconducting product while effectively restricting thermal contraction or distortion. Consequently, it becomes possible to manufacture a superconducting product with a complicated shape on a mass production scale.

According to a sixth characterizing feature of the invention, the coating material for coating the core particle has a fusing point lower than a temperature range detrimental to the superconductivity of the product. In the case of core particle containing Y, the same provides superconductivity when its crystal structure is maintained as a rhomboric system. However, the superconductivity is lost when the material is heated at a temperature exceeding 550 degrees Celsius and the crystal structure changes into a tetragonal system. Accordingly, if the coating material has a fusing point exceeding 450 degrees Celsius, and if a heat source exceeding about 550 degrees Celsius is employed for improving the efficiency of thermo fusing operation of this coating material, there is good possibility that the core material will lose the superconductivity. Similarly, in the case of core particle containing Bi, the particle is likely to lose its superconductivity if heated at a temperature above 860 degrees Celsius. Then, it is conceivable to carry out the molding operation by heating and cooling after simply stirring and mixing a low-fusing-point core particle material. However, this will result in undesirable unevenness in the mixture, and it becomes substantially impossible to evenly disperse the low-fusing-point material among the core particles. As a result, there occurs disadvantageous irregular particle size distribution in the molded product which leads to local differences in the Meissner effect. Also, since some of the core particles will remain unbonded by the coating material, there occurs deterioration in the physical strength of the molded product. Further, the time required for the thermal fusing operation tends to be longer because of the excess of the coating material at some portions.

With the sixth characterizing feature of the present invention, the core particles do not lose their superconductivity in the course of heat fusing process of the coating material conducted during the superconducting product molding operation. And, the distribution of the core particles and the coating material may be averaged reliably, whereby the obtained mold product will stably provide the Meissner effect throughout the same. Further, since the coating material may be reliably dispersed among the core particles by an appropriate amount, the product will acquire a superior physical strength. With these effects, it has become possible to carry out the heat fusing operation of the coating material more speedily and efficiently.

According to a seventh characterizing feature of the invention, the superconducting product is a superconducting wire product, and the coating material comprises a fine powder or thin film of either or both of Au and Ag, and the filling step includes the steps of filling the tertiary material in the pipe and wire-drawing the pipe filled with the tertiary material.

With the above-described seventh characterizing feature of the present invention, the following advantageous effects have been achieved:

(a) Since the sintering operation takes place prior to the pipe filling operation, the high-temperature heating operation conventionally effected on the material inside the pipe has become unnecessary. Also, since the Au or Ag having a low fusing point is heat-fused inside the pipe, the heating temperature applied on the pipe may be relatively low.

(b) Because of the low temperature process described in the above (a), any undesirable reaction will not occur between the superconducting material and the pipe.

(c) Because of the low temperature process of the above (a), the superconducting material will maintain its superconductivity.

Also, when the Au or Ag coating the core particles is heat-fused and then hardened, the core particles may be firmly bonded with each other by the highly conductive Au or Ag.

Accordingly, the superconducting material per se inside the pipe will acquire sufficient conductance. Moreover, if the Au or Ag between the superconducting core particles is formed sufficiently thin, the Au or Ag per se acts as a pseudo-superconductor because of the proximity effect, which quasi-superconducting effect advantageously enhances the superconductivity of the core particles.

(d) Because of the reaction prevention of (b) and of the enhanced superconductivity of the core particles of (c), the pipe may be formed of such inexpensive material as copper or aluminum rather than expensive Ag which has been commonly employed in the prior art. Further, if the pipe is formed of such non-cunductive material as glass fiber, the product may be used with an alternate current system which application has been impossible for the conventional superconducting products.

(e) Because of the low-temperature process of (a), it becomes possible to eliminate deterioration of oxide component of the superconducting material. Further, the conventionally practised feeding process of O into the pipe becomes unnecessary, whereby the manufacture of superconducting wire product has becomes significantly facilitated and less costly.

Other objects, features and advantages of the present invention will become apparent from the following description of preferred embodiments with reference to the accompanying drawings.

BRIEF DESCRIPTION OF THE DRAWINGS

Accompanying drawings FIGS. 1 through 5 illustrate preferred embodiments of the present invention; in which, FIG. 1 is a flow sheet, FIG. 2 is a conceptual view of a friction-pulverizing mixer, FIG. 3 is a section veiw taken along a line III—III of FIG. 2, FIG. 4 is a conceptual view of a thin film forming device illustrating experiments, FIGS. 11b through 11d are X-ray analized views of Y, Ba and Cu components of the composite granular material obtained through a primary pulverizing-mixing step by the mechanofusion effect.

DESCRIPTION OF THE PREFERRED EMBODIMENTS

Figure 1:
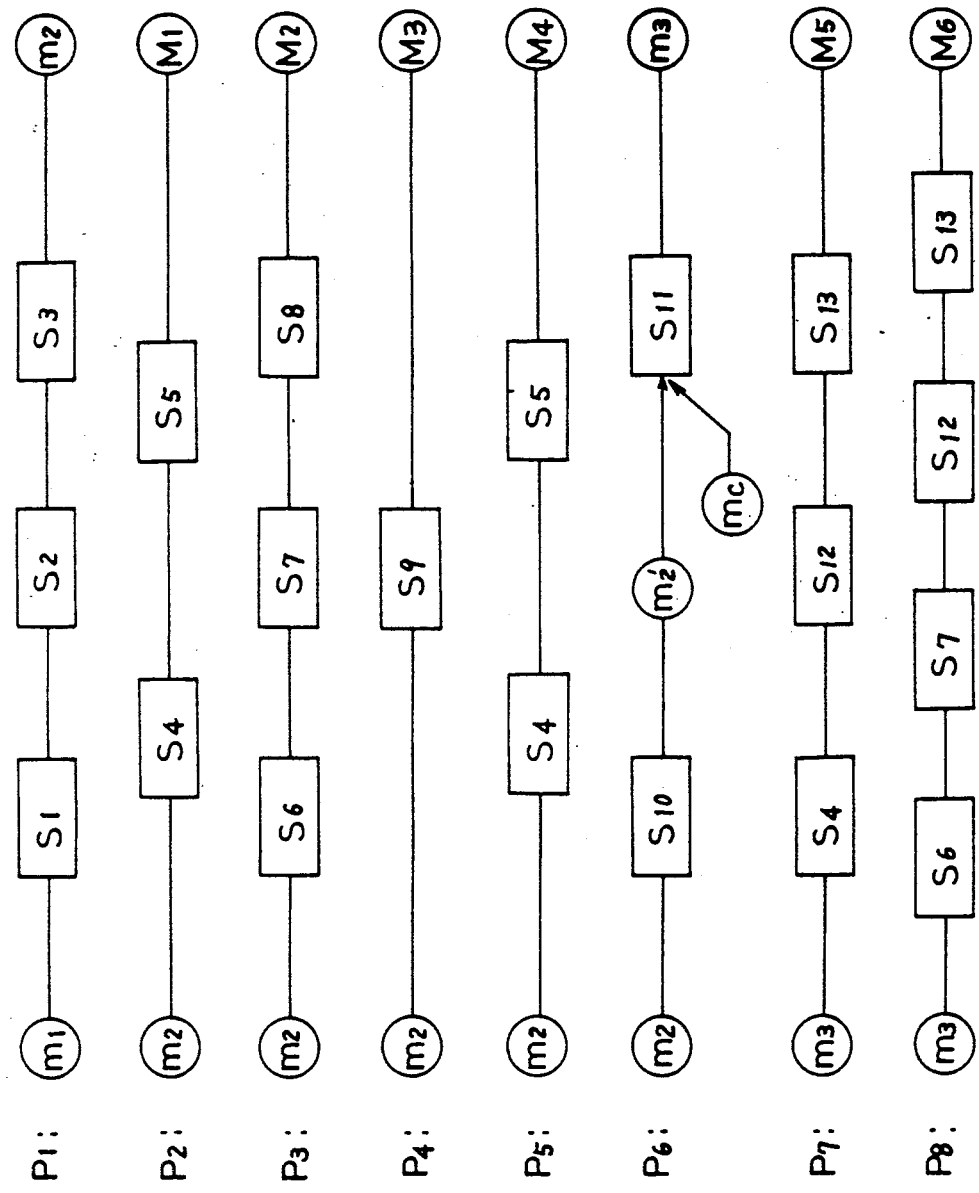

A process P1 illustrated in FIG. 1 includes three steps S1 through S3: a primary milling/mixing step S1 of milling and mixing a measured amount of fine powderly primary material m1 by a dry type friction-pulverizing mixer, a heat-processing step S2 of heat-processing the material obtained at step S2 and a secondary milling/mixing step S3 of further milling and mixing the material obtained by step S2 by the dry type friction-pulverizing mixer. The above process P1 through its three steps S1 through S3 produces a fine powderly secondary material m2 including the primary material m1 with its fine particle partially fused with Y or Bi. In the above secondary milling/mixing step S3, the material is granulated through thermal fusion of fine particles. This granulation, preferably, should take place to produce particles in the order of several $\mu m$ to a few tens of $\mu m$ in case the secondary material m2 is to be used for manufacturing a superconducting wire product. In the heat-processing step S2, after preliminarily heating the material for about 2 hours at 400 degrees in Celsius, the material is again heated for about 4 hours at 900 degrees Celsisus in the case of Y-containing secondary material m2 or for about 16 hours at 800 degrees Celsius in the case of Bi-containing secondary material.

Figure 2:
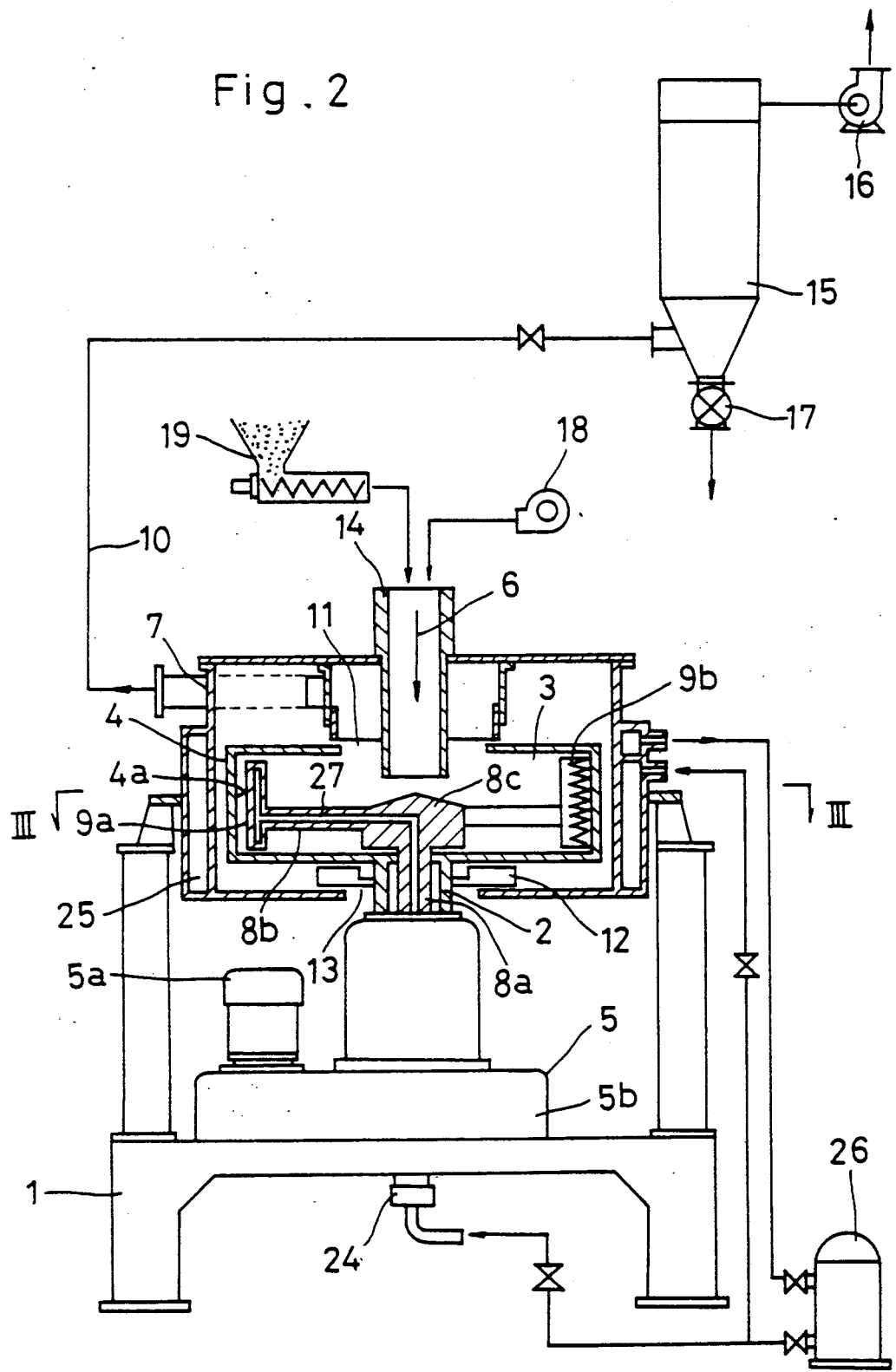
Figure 3:
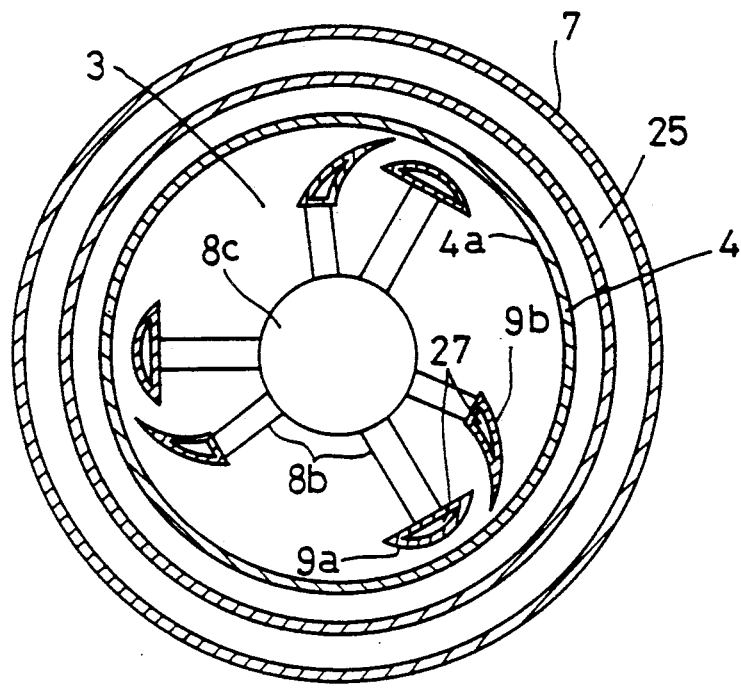

Next, the friction-pulverizing mixer will be particularly described with reference to FIGS. 2 and 3.

At an upper end of a vertically-oriented rotational tubular shaft 2 mounted on a base table 1, there is coaxially formed a tubular casing 4 forming a processing chamber 3. To a lower end of the tubular shaft 2, there is operatively connected a drive device 5 including an electric motor 5a, a change-speed device 5b and so on. In operation, as the motor rotates the casing 4 at a high speed via the shaft 2, there is continuously generated, in the casing 4, a centrifugal force which strongly presses the fine powderly material m1 against an inner surface 4a of the casing 4. The rotational speed of the casing 4 is adjustable so as to generate an appropriate centrifugal force depending on the properties of the material m1.

The casing 4 is surrounded by a cover 7 and is cooled by an ambient air introduced through an air inlet opening 13 defined in the cover 7 by a suction fan 12 attached to the lower position, i.e. the tubular shaft 2 of the casing 4. The ambient air is utilized also for transporting the secondary material m2 of the processed chamber through a transport passage 10 connected with the cover 7. Further, for transporting the secondary material m2 from the interior of the processing chamber 3 to the side of the cover 7, the casing 4 defines at an uppermost central position thereof an overflow type material outlet opening 11.

The tubular shaft 2 accommodates therein a coaxial inner rotational shaft 8a having a conical top 8c which projects into the processing chamber 3 and continuously forms thereabout a plurality of supports 8b horizontally extending inside the chamber 3, with the supports 8b being dispersed with an appropriate angular displacement with each other. The supports 8b alternately and fixedly carry at free ends thereof friction-pulverizing elements 9a for milling the material by pressing the same against the rotating inner surface 4a of the casing 4 and scraping elements 9b for stirring and mixing the material frictionally pulverized by the friction-pulverizing elements 9a and adhering to the inner casing surface 4a by scraping the material off the surface 4a. Each friction-pulverizing element 9a has a curved working edge having a gradually increasing distance from the inner casing surface 4a in the rotational direction, i.e. the counterclock direction in FIG. 3, of the casing 4. On the other hand, each scraping element 9b has a wedge or comb-shaped curved working edge having a gradually decreasing distance from the surface 4a in the rotational direction of the casing 4. In operation, as the casing 4 is rotated in said direction, in cooperation with the rotating surface 4a, each friction-pulverizing element frictionally pulverizes the primary material m1 by strongly pressing the same against the surface 4a and then the scraping element subsequent thereto scrapes the pulverized material off the surface and efficiently stirs and mixes the same. With these pulverizing and scraping/mixing operations are alternately repeated with the casing rotation, the primary material m1 may be efficiently processed inside the processing chamber 3.

The inner rotational shaft 8a defines therein a passage 27 communicated with a medium depositing tank 26 and adapted for allowing a flow therethrough of a heating or cooling medium from the tank 26 via a rotary joint 24 to reach the supports 8b, friction-pulverizing elements 9a and the scraping elements 9b for heating or cooling the same.

Centrally of the cover 7, there is provided a pipe 14 defining therein a passage 6 extending into the processing chamber 3 and for downwardly transporting the primary material m1 from a feeder 19 onto the common conical top 8c of the supports 8b. This passage 6 is connected with a blower 18 for feeding a material transporting gas which comprises an appropriate amount of air or inactive gas heated or cooled depending on the necessity. Further, the cover 7 has a portion of its peripheral wall enclosed in a jacket 25 which permits the flow therethrough of a heating or cooling medium supplied from the medium depositing tank 26.

For collecting the secondary material m2 from inside the processing chamber 3 through the outlet opening 11, the transport passage 10 is connected with a collector container 15 and a blower 16 in this order, with the container 15 having at an outlet opening thereof a rotary feeder 17 for collecting the secondary material m2.

Next, operations of the friction-pulverizing mixer having the above-described costruction will be more particularly described.

With a high-speed rotation of the casing 4, the fine powdery primary material m1 fed from the feeder 19 is strongly pressed against the inner casing surface 4a by the centrifugal force, thereby forming a layer of the material m1 on the surface 4a, and concurrently therewith, this material layer is repeatedly friction-pulverized and then scraped and mixed alternately by the friction-pulverizing elements 9a and the scraping elements 9b in cooperating with the inner casing surface 4a being rotated relative thereto. For obtaining the mechano-fusing effect in the above process, it is preferred that the rotational speed of the casing 4 should be so adjusted as to provide the material layer with an acceleration exceeding 100 G. This obtained secondary material m2 is transported by the transporting gas from the processing chamber 3 and collected at the collector container 15.

Thereafter, in a second process P2 illustrated in FIG. 1, the secondary material m2 obtained by the step S3 of the first process P1 is molded at step S4 and then baked at step 5 to obtain a superconducting material M1.

Next, a first sample experiment using the above-described processes P1 and P2 will be specifically described.

Figure 6:
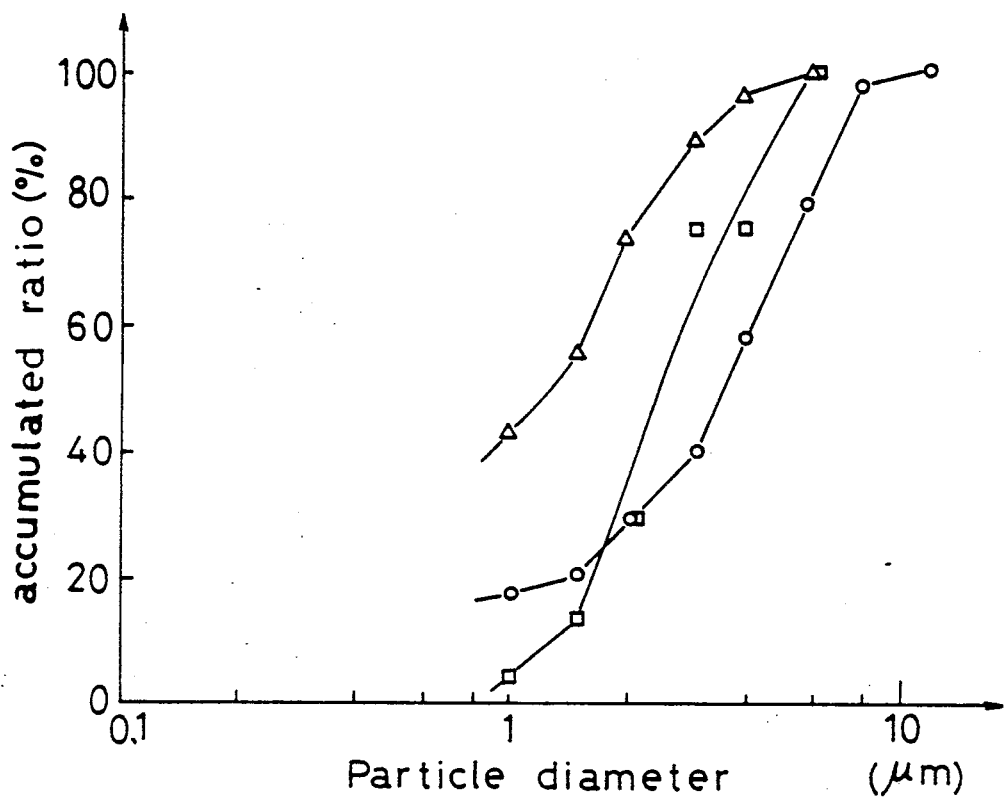
FIGS. 6 through 10 are graphs illustrating experiment results.

(a) The primary material m1 was prepared by mixing $Y_2O_3$ $BaCO_3$ and $CuO$ respectively by the weight ratio of $Y_2$: Ba: Cu=1:2:3. FIG. 6 shows the particle size distribution of this prepared primary material m1 analized by the known laser diffraction method (triangles for $BaCo_3$; rectangles for $CuO$, and circles for $Y_2O_3$, respectively).

Figure 7:
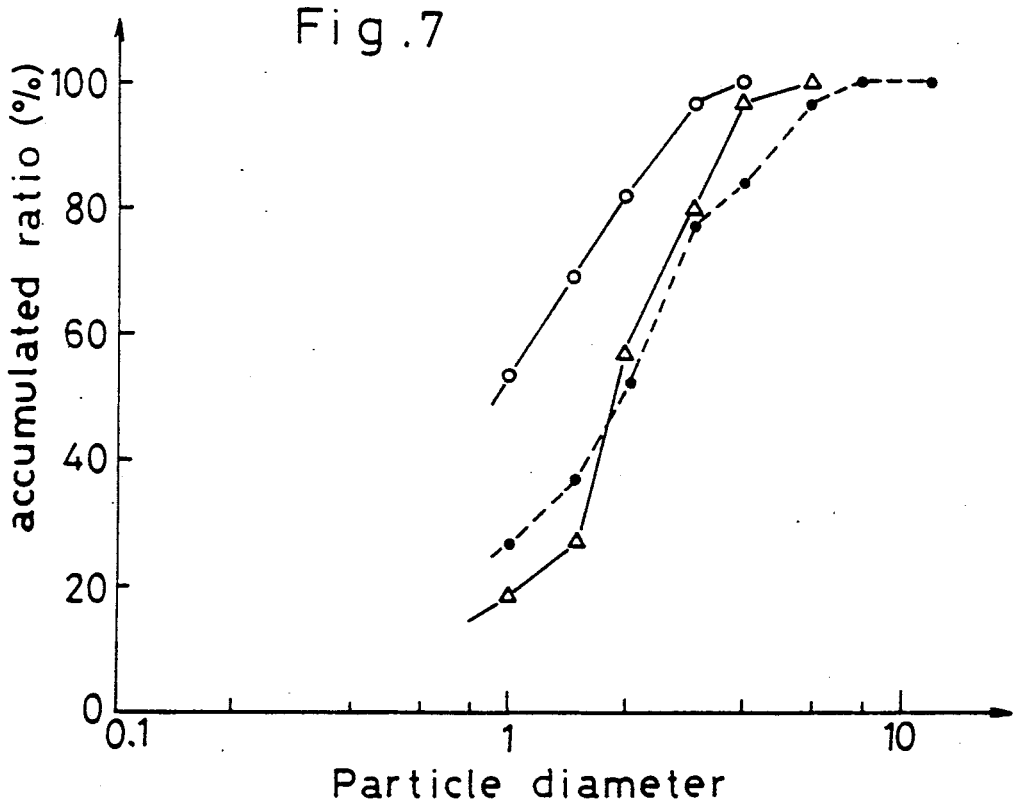

(b) The above primary material m1 was sampled and then processed by the aforementioned friction-pulverizing mixer for 1.5 hours at 80 to 140 degrees Celsius (step 1). Then, a laser diffraction analysis was again conducted on the particle size distribution of this material m1 obtained by the step 1. The result is indicated in FIG. 7 by circle marks which shows finer pulverization in comparion with the particle size distribution of the raw material indicated by blackened circles in the same drawing). Incidentally, the triangle marks indicate particle size distribution of material obtained by heat-processing the fine powderly primary material m1 after the primary milling/mixing process S1.

Figure 8:
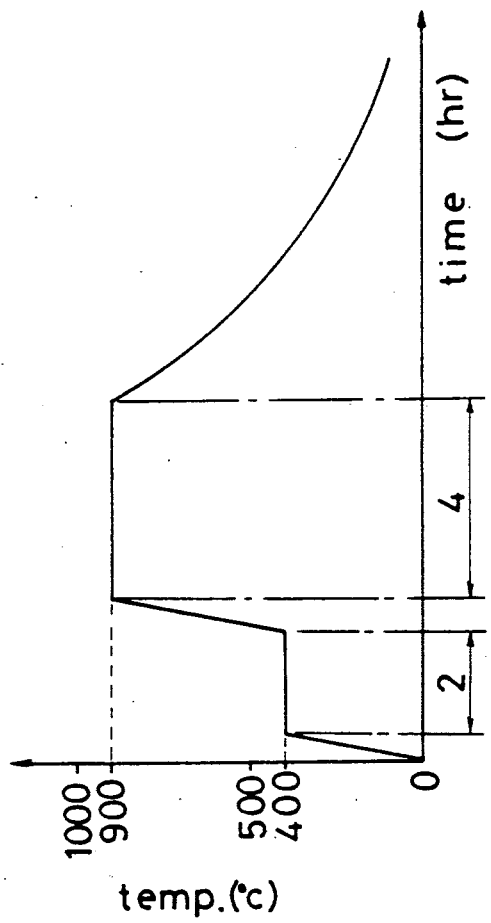

(c) The primary material m1 obtained by the primary milling/mixing step S1 was caused to undergo a heat-processing step S2 at an electric furnace for obtaining solid phase reaction among the respective components and for eliminating resultant gaseous matters and inpurities. FIG. 8 shows the temperature variation at the furnace.

Figure 9:
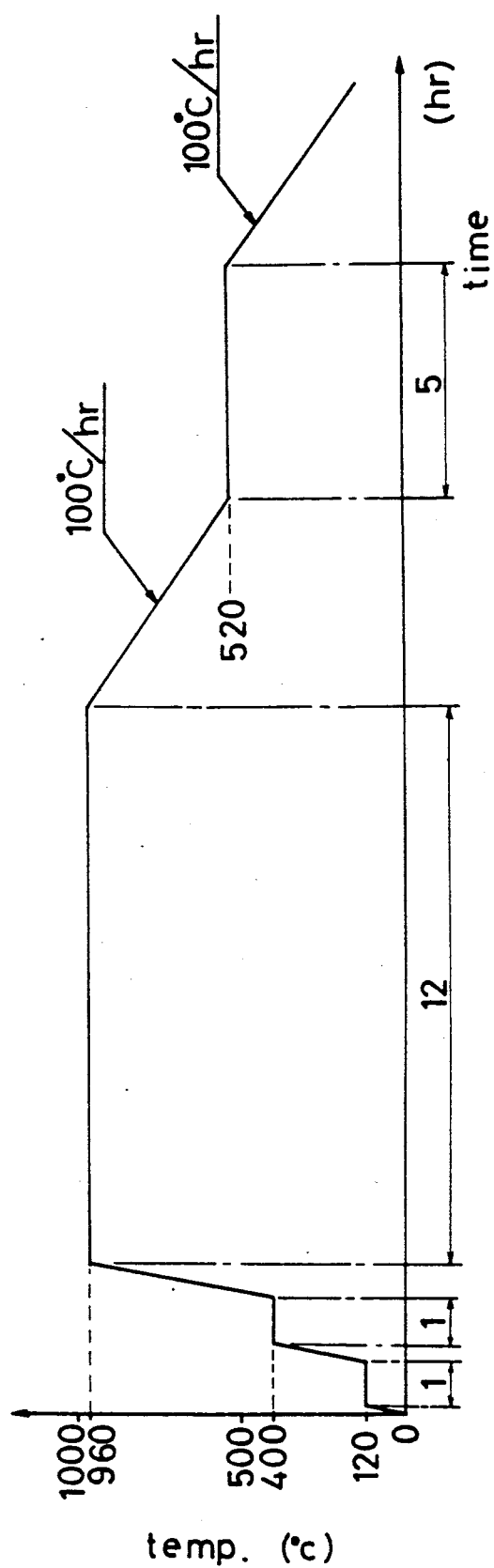

(d) The primary material m1 obtained by the heat-processing step S2 was caused to undergo a secondary milling/mixing step S3 using the above-described friction-pulverizing mixer for one hour at 120 degrees Celsius. The particle size distribution of this obtained secondary material m2 from the step S3 was measured by the laser diffraction method, which results are indicated by triangle marks in FIG. 7. As shown, the distribution curve sharply rises at the vicinity of 1.5 to 4.0 $\mu m$, thereby indicating that the particle sizes are sufficiently (e) The secondary material m2 from the step S3 was molded and then baked in the electric furnace at step S5 to obtain the superconducting material M1. FIG. 9 shows the temperature variation in the electric furnace.

Figure 10:
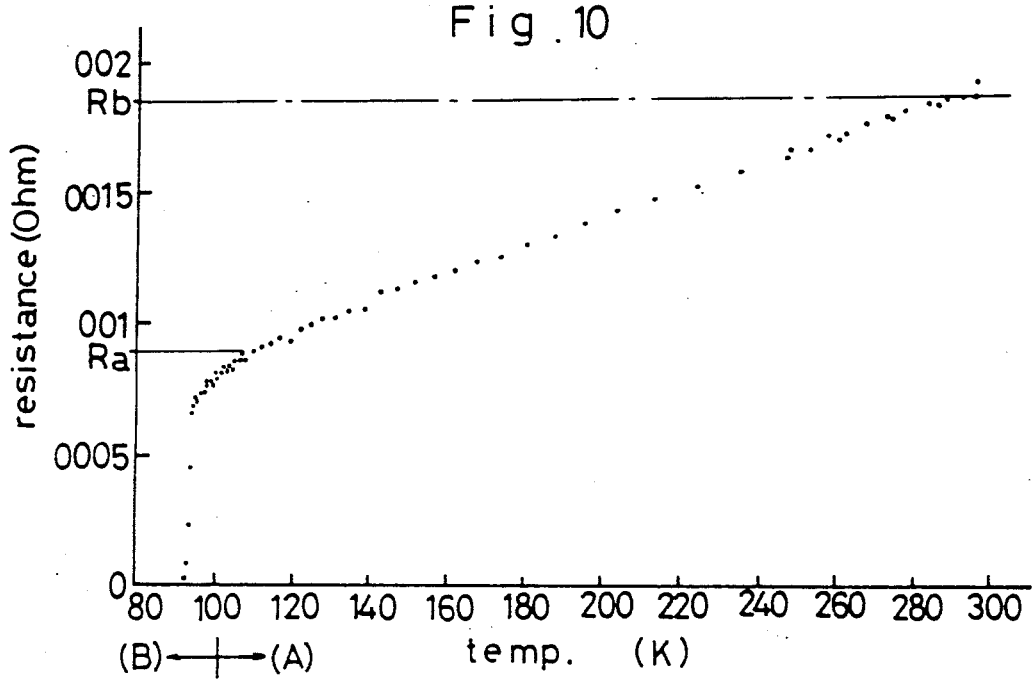
Figure 12:
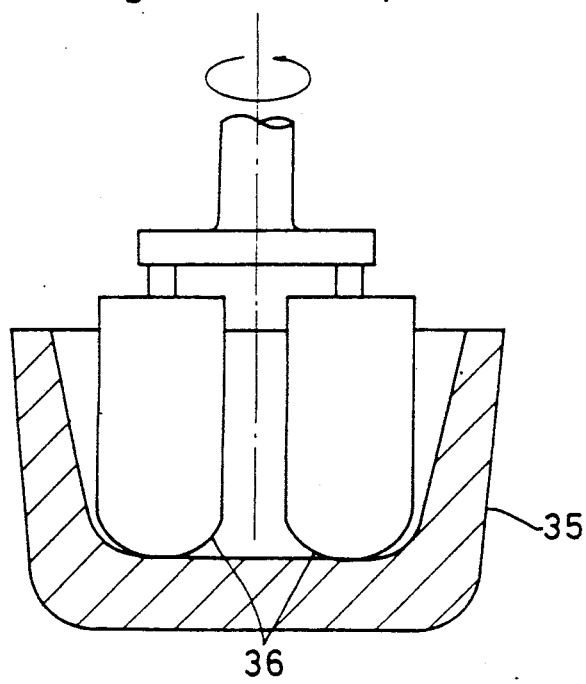
FIGS. 12 and 13 are conceptual views for illustrating the prior art.
Figure 13:
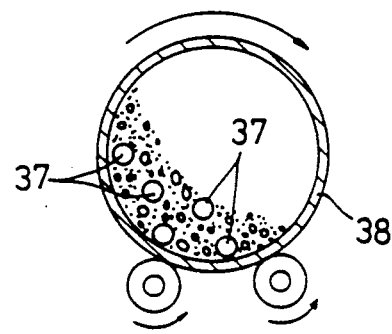

(f) The relationship between the temperature of the superconducting material M1 and the electric resistance was measured, which results are shown in FIG. 10.

Figure 11B:
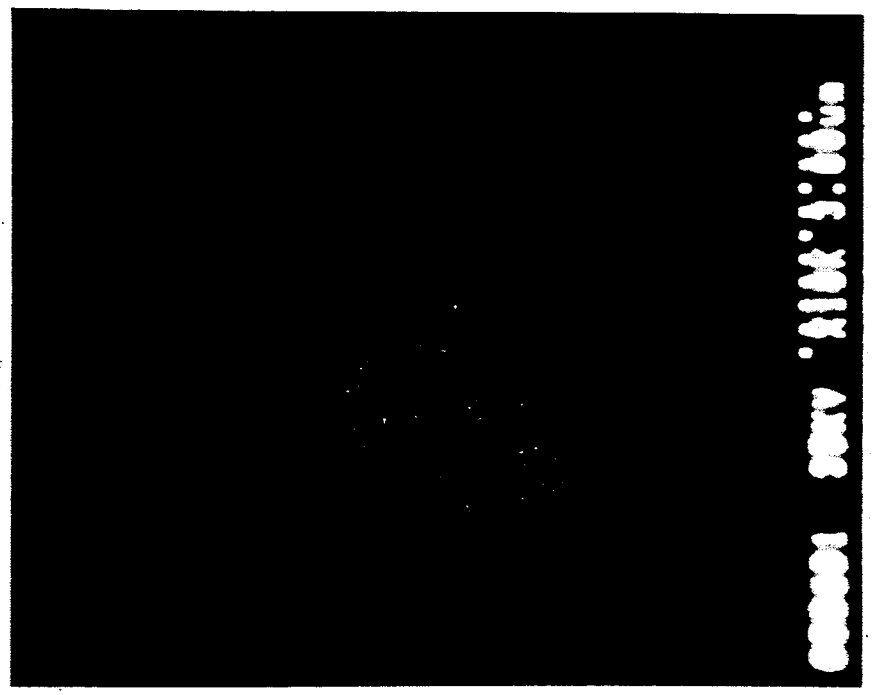
Figure 11A:
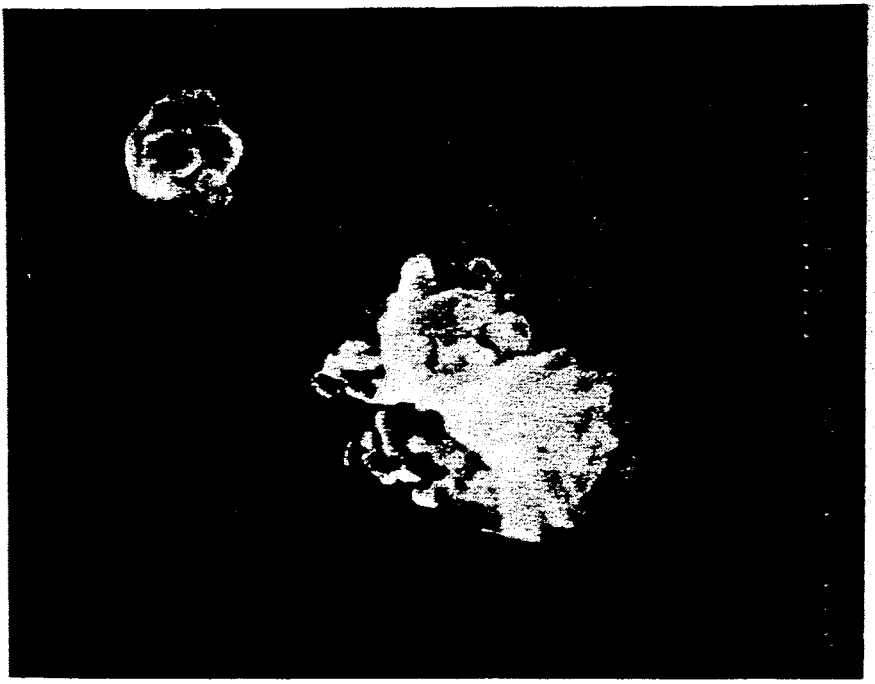
FIG. 11a is an SEM view of a composite granular material obtained through a primary pulverizing-mixing step by the mechanofusion effect.

In the drawing, a mark Ra denotes resistance of the superconducting material at a temperature where the resistance starts falling sharply while a mark Rb denotes resistance of the same at a room temperature. The results show Rb/Ra >2 and a sharp drop of resistance at about 100 K, which proves the high quality of this superconducting material M1. An SEM image of the fine powdery primary material m1 obtained through the primary milling/mixing step S1 is shown in FIG. 11a. In this primary material m1, as illustrated in the X-ray analyzed images of FIGS. 11b through 11d, it may be observed that the respective components of Y, Ba and Cu are substantially uniformly dispersed.

Next, manufacturing methods of target materials M3 and M4 for forming a thin film of the superconducting material will be particularly described.

As illustrated in a process P4 in FIG. 1, the fine powderly secondary material m2 is filled in a highly conductive copper casing at step S9 and formed as the target material M3. Alternately, as illustrated in a process P5, the secondary material m2 may undergo a baking process S5 to obtain the target material M4.

Figure 4:
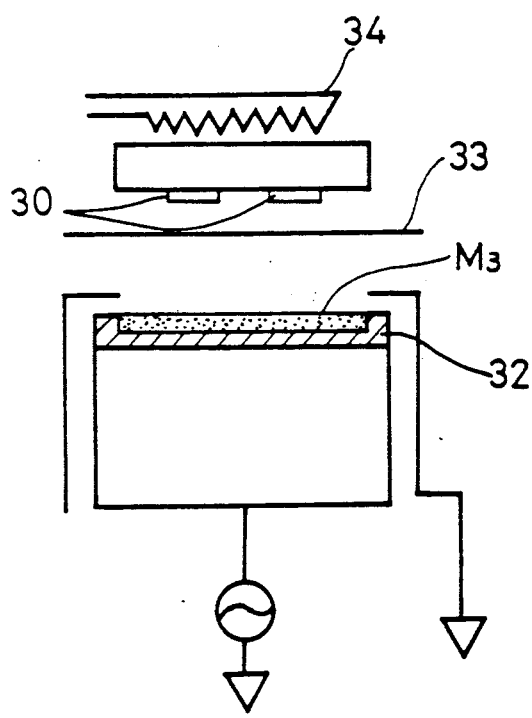

This prepared target material M3 is used with a magnetron sputtering device shown in FIG. 4 for obtaining a superconducting thin film. In this sputtering device, a base plate 30 is disposed above the target material M3 filled in the copper (good conductor) casing 32. Between the base plate 30 and the target material M3, there is provided a shutter 33. The copper casing 32 is cooled from below so as to minimize temperature rise in the target material M3 during the sputtering operation. Also, a heater 34 is provided above the base plate 30 for heating the same.

Next, a second sample experiment will be specifically described.

(a) For obtaining a target material for forming a superconducting thin film, the primary material m1 was prepared by mixing $Bi_2O_3$, $SrCO_3$, $CaCO_3$ and CuO by the weight ratio of 2.8: 2.0: 2.1: 3.0.

(b) The above primary material m1 was sampled and then processed by the aforementioned friction-pulverizing mixer for 1 hour at 100 to 150 degrees Celsius (step 1).

(c) The primary material m1 obtained by the primary milling/mixing step S1 was caused to undergo a heat-processing step S2 at the electric furnace for obtaining solid phase reaction among the respective components and for eliminating resultant gaseous matters and impurities. The heat-processing step took place for 10 hours at the temperature of 840 degrees Celsius.

(d) The primary material m1 obtained by the heat-processing step S2 was caused to undergo a secondary milling/mixing step S3 using the above-described friction-pulverizing mixer for half an hour at 100 to 150 degrees Celsius, thereby obtaining the fine powderly secondary material m2.

(e) The secondary material m2 from the step S3 was filled into the copper casing (step S9) thereby obtaining the powderly target material M3.

(f) This prepared target material M3 was used with the magnetron sputtering device shown in FIG. 4 for obtaining a superconducting thin film of Bi. More specifically, the air was exhausted to 10 Torr by using a rotary pump and an oil diffusion pump. Then, the sputtering operation took place under the conditions of: 200 W output and $6.0 \times 10^{-2}$ Torr ($O_2$: $1.2 \times 10^{-2}$ Torr, Ar: $4.8 \times 10^{-2}$ Torr) sputtering gas pressure. Also, a pre-sputtering operation was conducted for 1 hour and then the film forming operation took place for 5 hours. This obtained film had a thickness of approximately 1 $\mu$m. In the sputtering operation, the distance between the target material and the base plate was 50 mm, and the base plate was maintained at the temperature of 500 degrees Celsius. As the base plate, a monocrystal (10 mm, 0.5 mm in thickness) of MgO (100) was employed.

Then, a composition analysis was conducted on thus obtained thin film by using an ICP (Inductive Coupled Plasmatomicemission Spectorscopy), thereby checking change in the composition in each obtained film. The analysis results reveal that the composition change was well controlled within a few percents thereby proving that the above process may stably provide a superconducting material thin film with good reproductivity, i.e. with minimized composition variations.

As described above, in comparison with the conventional ball milling method, the target material manufacturing method of the invention for forming a superconducting material thin film is advantageous for the significantly reduced processing time period and also for superior composition reproducibility of the film.

Incidentally, in the above-described sample experiment 2, it has been found out that the film will acquire an even superior superconductivity if a portion of the composition amount of Bi is replaced by Pb. However, since Pb has a fusing point of 327 degrees Celsius which is significantly lower than the effective heat-processing temperature of 800 degrees Celsium of the Bi group, it is impossible to add Pb at the heat-processing step S2 using such high processing temperature as will cause fusion of Pb. For this reason, as will be described in a sample experiment 3 to follow, if Pb is added after the heat-processing step S2, it becomes possible to obtain a superconducting thin film with a desired composition.

Next, this sample experiment 3 will be particularly described.

(a) For obtaining a target material for forming a superconducting thin film, the primary material m1 was prepared by mixing $Bi_2O_3$, $SrCo_3$, $CaCO_3$ and CuO by the weight ratio: Bi: Sr: Ca: Cu=2.1: 2.0: 2.1: 3.0.

(b) The above primary material m1 was sampled and then processed by the aforementioned friction-pulverizing mixer for 1 hour at 100 to 150 degrees Celsius (step 1).

(c) The primary material m1 obtained by the primary milling/mixing step S1 was caused to undergo a heat-processing step S2 for 10 hours at the furnace temperature of 840 degrees Celsius.

(d) The primary material m1 obtained by the heat-processing step S2 was added with Pb by the ratio of: Bi: Pb=2.1: 0.7. Then, this mixture was caused to undergo a secondary milling/mixing step S3 using the above-described friction-pulverizing mixer for half an hour at 100 to 120 degrees Celsius, thereby obtaining the fine powderly secondary material m2.

(e) The secondary material m2 from the step S3 was filled into the copper casing (step S9) thereby obtaining the powderly target material M3.

(f) This prepared target material M3 was used in the same manner as described in the foregoing sample experiment 2 for obtaining a superconducting thin film. Again in the same manner as described in the sample experiment 2, a composition analysis was conducted on this obtained thin film, thereby checking change in the composition in each obtained film. The analysis results reveal that the composition changes were well controlled within a few percent.

Further, one of these sampled thin films was heat-processed at 855 degrees Celsius for 50 hours. This prepared superconducting thin film had superior superconductivity in which the electric resistance sharply drops from the vicinity of 110 K and drops finally to zero at approximately 100 K.

Next, a manufacturing method of a superconducting wire product M2 will be particularly described.

As illustrate in a process P3 of FIG. 1, at

As illustrated in a process P3 of FIG. 1, at process S6, the fine powderly secondary material m2 obtained from the above-described process P1 is filled into a small-diameter pipe made of highly conductive material as Ag or of non-conductive material. Then, at step S7, this pipe filled with the secondary material m2 is caused to undergo a wire-drawing operation to be linearly extended into a diameter of 0.1 μm to a few μms.

Next, the secondary material m2 filled in the extended pipe from the step S7 is caused to undergo a sintering process at step S8 thereby obtaining the superconducting wire product M2.

In the above sintering step S8, if the secondary material m2 contains Y, the material is first heated generally at 900 to 930 degrees Celsius for about 12 hours and then gradually cooled by 100° C./hr. Thereafter, the material is heated at approximately 520 degrees Celsius for about 5 hours and again gradually cooled by 100° C./hr. On the other hand, if the secondary material m2 contains Bi, the material is first heated at 800 to 890 degrees Celsius and then cooled gradually.

Incidentally, if Ag in the form of powder is mixed into the secondary material m2 before filling the same into the pipe at step S6, this will advantageously improve the fluidity of the material and also increase the current density of the same.

Next, a manufacturing method of a fine powderly tertiary material m3 having its superconducting core particles coated with a coating material.

As illustrated in a process P6 of FIG. 1, the fine powderly secondary material m2 is caused to undergo a sintering process at step S10 thereby obtaining a granulated core particle m2' containing Y or Bi. The conditions of this sintering process at step S10 are the same as those in the foregoing process P3 for superconducting wire member.

Next, an appropriate amount of coating material is added to the granulated core core particle material m2' and this mixture is frictionally pulverized and mixed by using the friction-pulverizing mixer. In this operation, as described hereinbefore, since the surface of the granulated core particle m2' is highly activated, the pulverized coating material strongly adheres to the core particle and coats the same. Through this coating process at step S11, there is obtained the fine powdery tertiary material m3 having its granulated core particles m2' coated with the coating material. The coating material may be appropriately selected from resinous granular material such as a fluoride resin or fine powder or foil of Au, Ag, or Cu. In selecting the same; however, those which become brittle in the low temperature condition for using the superconducting material or which directly react to the granulated core particles m2' or which absorb water should be excluded from the selection. The mixture ratio of the coating material should range between several percents to a few tens of percents.

Further, if the granulated core particle m2' contains Y, the coating material to be mixed therewith should have a fusing point no higher than 450, or preferably 300 degrees Celsius. On the other hand, if the particle m2' contains Bi, the coating material should have a fusing point no higher than 800 or preferably 400 degrees Celsius.

Incidentally, the fusing points of Au, Ag and Cu drop as the material becomes finer or thinner. Specifically, with a particle size in the order of $10^{-2}$ μm, the sintering takes place at 200 to 400 degrees Celsius. Therefore, the particle diameter or the thickness of the material shoulder be properly adjusted in relation with the predetermined fusing point.

Figure 5A:
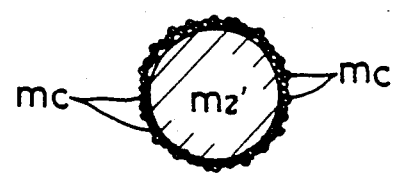
FIGS. 5a and 5b are conceptual views of sections of a tertiary material.
Figure 5B:
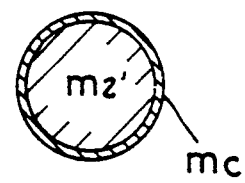

In the fine poewdery tertiary material m3, the graulated core particle material m3' may be mechanofused through milling with a great number of coating material particles or foils mc as illustrated in FIG. 5a, or the same may have its entire surface mechanofused and coated with the coating material mc in the form of foil.

Next, a manufacturing method of another superconducting mold product M5 will be particularly described.

As illustrated in a process P7 of FIG. 1, the fine powderly tertiary material m3 obtained through the forgoing process P6 is filled into a mold and heated (step S12) and then heat-fused with the coating material mc. Thereafter, the granulated core particle mateiral m2' and the coating material mc in the mold are cooled together at step S13. With this cooling, the coating material mc hardens, whereby a superconducting mold product M5 may be obtained.

In the above heating process step S12 effected on the tertiary material m3 filled in the mold, if the tertiary material m3 contains Y, the heating temperature should be appropariately adjusted in relation with the types of employed granulated core paticle material m2' and of the coating material mc such that the crystal structure of the granulated core particle material m2' should not change into a tetragonal system but be maintained as a rhombic system for achieving the superconducting characteristics and also that the coating material mc may be heat-fused sufficiently for the molding. Specifically, if the tertiary material m3 contains Y, the heating temperature should be set lower than 500 degrees Celsisus. On the other hand, if the material m3 contains Bi, thhe temperature should be set below 800 to 865 degrees Celsius which is lower than the fusing point of from about 860 to about 870 degrees Celsius.

Next, a manufacturing method of another superconducting wire member M6 will be particularly described.

In this method, the coating material employed in the process P6 comprises e.g. Au or Ag (mc) in the form of fine powder or thin foil. In this obtained tertiary material m3, as illustrated in FIG. 5a, the granulated core particle material m2' is heat-fused through milling with a great number particles of thin films of coating material mc of Au or Ag.

As illustrated in a process P8 of FIG. 1, at step S6, the fine powdery tertiary material m3 obtained through the foregoing process P6 is filled into a small radius pipe made of such inexpensive conductive material as Cu or of a non-conductive material such as a low-fusing-point glass fiber. Through heating or cooling operation at step S7, this pipe is linearly extended by a wire drawing operation into a diameter of 0.1 μm to a few μms. This extended pipe is then heated at step S12, thereby heat-fusing the Au or Ag coating material mc. Thereafter, the pipe is cooled at step S13. With this cooling, the coating mateiral mc hardens, whereby a superconducting wire product M6 may be obtained. Incidentally, if a heating operation takes place in the wire drawing operation at step S7 for the coating material mc, the heating temperature should be appropriately adjusted in relation with the composition of the granulated core material m2' or with the fusing points of the fine power or thin foil of the Au or Ag coating material mc such that the crystal structure of the granulated core material m2' should not change into a tetragonal system but should be maintained as a rhombic system for achieving the superconducting characteristics and also that the coating material mc may be heat-fused sufficiently for the molding. Specifically, in case the tertiary material m3 contains Y, the heating temperature should be set than 550 degrees Celsisus. On the other hand, in case the material m3 contains Bi, the temperature should be set below 800 to 865 degrees Celsius which is lower than fusing point of from 860 870 degrees Celsius.

Next, some alternate embodiments of the invention will be specifically described.

(a) The specific construction of the dry type milling mixer may be conveniently modified. For instance, the rotatonal aixs of the coating 4 may be oriented horizontal or with an angular displacement rather than vertical. Similarly, the rotational axis of the milling elements ralative to the aixs of the casing 4 may be sloped as long as the centrifural force towards the inner casing surface 4a may be obtained. In the latter case, the primary material scraped off by the scraping element is again brought into pressure contact with the inner casing surface 4a at the velocity in the tangential direction of the surface. Further, it is to also conceivalble to urge by means of hydraulic pressure or a spring the friction-pulverizing elements 9a and the scraping elements 9b towards the inner casing surface 9b while maintaining non-contact condition between the same. Also, it is conceivable to drive and rotate the friction-pulverizing elements 9a and the scraping elements 9b per se so as to vary their speed relative to the casing independently of the centrifugal force of the casing. Of course, these elements may be maintained stil during the operations. The number, shape and characteristics of the friction-pulverizing elements 9a and the scraping elements 9b may be conviniently varied. For a butch processing, it is conceivable to provide a recycling system between the collector container 15 and the casing 4.

(b) In the gas phase method for obtaining the with film of the superconducting material by the target material M3 and M4, any other known methods may be selectively employed than the described sputtering method. For instance, it is possible to employ a vapor deposition method where an electron beam is caused to strike against the target material to evaporate elements thereby adhering the evaporated elements to the base platel. Also, the target material may include only one kind of component.

(c) The type, mixture ratio, particle size and other factors of the primary material ml may be conveniently varied. Also, depending on the type of primary material ml employed, it is conceivable to repeatedly carry out each of the heat-processing step S2 and the secondary milling/mixing processing step S3 for a plurality of times.

(d) The type, fusing point and mixture ratio of the coating material may be conveniently varied.

(e) The coating device used at the coating process effected at step S11 may be selected from various types of known coating devices. For example, the device may comprise a spray-drying type, fluidizedu-drying type or the mixing-granulating type.

(f) The temperature conditions of the heat processing at step S2, baking processing at step S5 and the sintering processing at step S8 may be selectively set depending on the type of primary material ml employed. Further, the specific method, equipment and shape of the mold may be conveniently selected.

(g) The superconducting mold products M1 and M5 may be used as a diamagnetic material also. For instance, the same may be used as a bearing element utilizing the Meissner effect. The applications of the superconducting mold products M1 and M5 and of the superconducting wire products M2 and M6 and of the materials m2 and m3 therefor may vary in many ways. Also, the thin film of the superconducting material may be utilized for electronic devices and other devices.

Incidentally, although reference marks and numerals are provided in the appended claims of patent application for the purpose of facilitating reference to the accompanying drawings, it is to be understood that the provision of these marks and numerals are not to limit the scope of the invention to the constructions illustrated in these drawings.

What is claimed is:

1. A method of manufacturing a superconducting material by use of a milling/mixer, said milling/mixer including a casing (4), including an inner casing surface, for holding a primary material therein and drivable to rotate about a rotational axis, a friction-pulverizing element (9a) and a scraping and mixing element (9b) provided separately from each other supported by supports (8b) and mutually rotatable about a rotational axis relative to said inner casing surface (4a), said friction-pulverizing element (9a) having a curved working portion having a leading edge and a trailing edge relative to a direction of rotation of said pulverizing element, with a spacing between said inner casing surface (4a) and said working portion gradually decreasing from said leading edge to a mid-point of the curved working portion and gradually increasing from said mid-point to said trailing edge, said method comprising the steps of adding a powdery primary material to said casing of said milling/mixer, rotating said casing of said milling/mixer at a high rotational speed thereby producing a centrifugal force resulting from the rotational speed of said casing and thereby pressing said powdery primary material against said inner surface (4a) of said casing, thereby restricting movement of said primary material and forming a layer of pressed material on said inner surface of said casing, simultaneously with rotation of said casing, rotating said pulverizing element (9a) and said scraping and mixing element (9b) relative to said casing, maintaining the relative rotational speed of said casing with respect to said pulverizing element and said scraping and mixing element, repeatedly friction-pulverizing the material by pressing the material against said inner surface (4a) of said casing by forcing the pulverizing element against a layer of material on said inner surface of said casing, thereby producing a friction-pulverized material and mixing said friction-pulverized material relative to said inner surface of said casing by scraping the friction-pulverized material off the inner surface in cooperation with friction-pulverization of said friction-pulverizing element (9a) by moving the mixing element along the inner surface of the casing into contact with the layer of material during rotation of said casing, said friction-pulverizing element (9a) and said scraping and mixing element (9b), thereby forming a friction-pulverized mixed primary material, heat-processing the friction-pulverized mixed primary material, thereby producing a heat-processed friction-pulverized mixed primary material, and repeating the rotation of the casing, repeatedly friction pulverizing the heat-processed friction-pulverized mixed primary material by pressing the primary material against said inner surface (4a) of said casing by forcing the pulverizing element against a layer of said primary material on said inner surface of said casing and mixing said primary material relative to said inner surface of said casing by scraping the friction-pulverized primary material off the inner surface of said casing by moving the scraping and mixing element along the inner surface of the casing into contact with the layer of primary material during rotation of said casing whereby said friction-pulverizing element (9a), and said scraping and mixing element form a fine powdery secondary material as a superconducting material, and directing the fine powdery secondary material to a collection container for further processing.

2. The method of manufacturing a superconducting material as set forth in claim 1 which includes applying a coolant air flow to said casing.

3. The method of manufacturing a superconducting material as claimed in claim 1, wherein said centrifugal force is generated from an acceleration exceeding 100 G.

4. The method of manufacturing a superconducting material as claimed in claim 1, wherein said secondary material is a fine powdery target material for forming a thin film of superconducting material.

5. The method of manufacturing a superconducting material as claimed in claim 1, wherein said secondary material is used for producing a superconducting wire product.

6. A method of manufacturing a superconducting material by use of a milling/mixer, said milling/mixer including a casing (4), including an inner casing surface, for holding a primary material therein and drivable to rotate about a rotational axis, a friction-pulverizing element (9a) and a scraping and mixing element (9b) provided separately from each other supported by supports (8b) and mutually rotatable about a rotational axis relative to said inner casing surface (4a), said friction-pulverizing element (9a) having a curved working portion having a gradually increasing spacing between said inner casing surface (4a) and a mid-point of the curved working portion thereof adjacent said inner casing surface in the rotational drive direction of said casing (4), said method comprising the steps of adding a powdery primary material to said casing of said milling/mixer, rotating said casing of said milling/mixer at a high rotational speed thereby producing a centrifugal force resulting from the rotational speed of said casing and thereby pressing said powdery primary material against said inner surface (4a) of said casing thereby restricting movement of said primary material and forming a layer of pressed material on said inner surface of said casing, simultaneously with rotation of said casing, rotating said pulverizing element (9a) and said scraping and mixing element (9b) relative to said casing, maintaining the relative rotational speed of said casing with respect to said pulverizing element and said scraping and mixing element, repeatedly friction-pulverizing the material by pressing the material against said inner surface (4a) of said casing by forcing the pulverizing element against a layer of material on said inner surface of said casing, thereby producing a friction-pulverized material and mixing said friction-pulverized material relative to said inner surface of said casing by scraping the friction-pulverized material off the inner surface in cooperation with friction-pulverization of said friction-pulverizing element (9a) by moving the mixing element along the inner surface of the casing into contact with the layer of material during rotation of said casing, said friction-pulverizing element (9a) and said scraping and mixing element (9b) thereby forming a friction-pulverized mixed primary material, heat-processing the friction-pulverized mixed primary material thereby producing a heat-processed friction-pulverized mixed primary material, and repeating the rotation of the casing, repeatedly friction pulverizing the heat-processed friction-pulverized mixed primary material by pressing the primary material against said inner surface (4a) of said casing by forcing the pulverizing element against a layer of said primary material on said inner surface of said casing and mixing said primary material relative to said inner surface of said casing by scraping the friction-pulverized primary material off the inner surface of said casing by moving the scraping and mixing element along the inner surface of the casing into contact with the layer of primary material during rotation of said casing whereby said friction-pulverizing element (9a), and said scraping and mixing element form a fine powdery secondary material as a superconducting material, and directing the fine powdery secondary material to a collection container for further processing, and molding the fine powdery secondary material thereby producing a molded fine powdery secondary material and baking the molded fine powdery secondary material, thereby obtaining a superconducting product.

7. The method of manufacturing a superconducting product as claimed in claim 6, wherein said superconducting product is a superconducting wire product, and wherein said molding and baking steps include the steps of;
filling the secondary material m2 into a pipe,
wire-drawing the filled pipe, and
sintering the secondary material m2 inside the pipe after said wire-drawing step.

8. A method of manufacturing a powdery target material for forming a thin film of a superconducting material by use of a milling/mixer, said milling/mixer including a casing (4), including an inner casing surface, for holding a primary material therein and drivable to rotate about a rotational axis, a friction-pulverizing element (9a) and a scraping and mixing element (9b) provided separately from each other supported by supports (8b) and mutually rotatable about a rotational axis relative to said inner casing surface (4a), said friction-pulverizing element (9a) having a curved working portion having a gradually increasing spacing between said inner casing surface (4a) and a mid-point of the curved working portion thereof adjacent said inner casing surface in the rotational drive direction of said casing (4), said method comprising the steps of adding a powdery primary material to said casing of said milling/mixer, rotating said casing of said milling/mixer at a high rotational speed thereby producing a centrifugal force resulting from the rotational speed of said casing and thereby pressing said powdery primary material against said inner surface (4a) of said casing thereby restricting movement of said primary material and forming a layer of pressed material on said inner surface of said casing, simultaneously with rotation of said casing, rotating said pulverizing element (9a) and said scraping and mixing element (9b) relative to said casing, maintaining the relative rotational speed of said casing with respect to said pulverizing element and said scraping and mixing element, repeatedly friction-pulverizing the material by pressing the material against said inner surface (4a) of said casing by forcing the pulverizing element against a layer of material on said inner surface of said casing, thereby producing a friction-pulverized material and mixing said friction-pulverized material relative to said inner surface of said casing by scraping the friction-pulverized material off the inner surface in cooperation with friction-pulverization of said friction-pulverizing element (9a) by moving the mixing element along the inner surface of the casing into contact with the layer of material during rotation of said casing, said friction-pulverizing element (9a) and said scraping and mixing element (9b) thereby forming a friction-pulverized mixed primary material, heat-processing the friction-pulverized mixed primary material thereby producing a heat-processed friction-pulverized mixed primary material, and repeating the rotation of the casing, repeatedly friction pulverizing the heat-processed friction-pulverized mixed primary material by pressing the primary material against said inner surface (4a) of said casing by forcing the pulverizing element against a layer of said primary material on said inner surface of said casing and mixing said primary material relative to said inner surface of said casing by scraping the friction-pulverized primary material off the inner surface of said casing by moving the scraping and mixing element along the inner surface of the casing into contact with the layer of primary material during rotation of said casing whereby said friction-pulverizing element (9a), and said scraping and mixing element form a fine powdery secondary material as a superconducting material, and directing the fine powdery secondary material to a collection container for further processing, filling a highly conductive copper casing with said fine powdery secondary material, thereby obtaining a powdery target material, and baking the copper casing filled with fine powdery secondary material, thereby obtaining a target material.

9. A method of manufacturing a superconducting material by use of a milling/mixer, said milling/mixer including a casing (4), including an inner casing surface, for holding a primary material therein and drivable to rotate about a rotational axis, a friction-pulverizing element (9a) and a scraping and mixing element (9b) provided separately from each other supported by supports (8b) and mutually rotatable about a rotational axis relative to said inner casing surface (4a), said friction-pulverizing element (9a) having a curved working portion having a gradually increasing spacing between said inner casing surface (4a) and a mid-point of the curved working portion thereof adjacent said inner casing surface in the rotational drive direction of said casing (4), said method comprising the steps of adding a powdery primary material to said casing of said milling/mixer, rotating said casing of said milling/mixer at a high rotational speed thereby producing a centrifugal force resulting from the rotational speed of said casing and thereby pressing said powdery primary material against said inner surface (4a) of said casing thereby restricting movement of said primary material and forming a layer of pressed material on said inner surface of said casing, simultaneously with rotation of said casing, rotating said pulverizing element (9a) and said scraping and mixing element (9b) relative to said casing, maintaining the relative rotational speed of said casing with respect to said pulverizing element and said scraping and mixing element, repeatedly friction-pulverizing the material by pressing the material against said inner surface (4a) of said casing by forcing the pulverizing element against a layer of material on said inner surface of said casing, thereby producing a friction-pulverized material and mixing said friction-pulverized material relative to said inner surface of said casing by scraping the friction-pulverized material off the inner surface in cooperation with friction-pulverization of said friction-pulverizing element (9a) by moving the mixing element along the inner surface of the casing into contact with the layer of material during rotation of said casing, said friction-pulverizing element (9a) and said scraping and mixing element (9b) thereby forming a friction-pulverized mixed primary material, heat-processing the friction-pulverized mixed primary material thereby producing a heat-processed friction-pulverized mixed primary material, and repeating the rotation of the casing, repeatedly friction pulverizing the heat-processed friction-pulverized mixed primary material by pressing the primary material against said inner surface (4a) of said casing by forcing the pulverizing element against a layer of said primary material on said inner surface of said casing and mixing said primary material relative to said inner surface of said casing by scraping the friction-pulverized primary material off the inner surface of said casing by moving the scraping and mixing element along the inner surface of the casing into contact with the layer of primary material during rotation of said casing whereby said friction-pulverizing element (9a), and said scraping and mixing element form a fine powdery secondary material as a superconducting material, and directing the fine powdery secondary material to a collection container for further processing, filling a highly conductive copper casing with said fine powdery secondary material, thereby obtaining a powdery target material, baking the copper casing filled with said fine powdery secondary material, thereby obtaining a baked fine powdery secondary material, sintering said baked fine powdery secondary material, thereby producing a granulated core particle material, adding said granulated core particle material to said casing of said milling/mixer, adding a coating material to said casing; and repeating the rotation of the casing thereby, forming a layer of said granulated core particle material on said inner casing surface, and scraping the layer of material by contacting the scraping and mixing element (9b) with said layer on the inner casing surface (4a), repeatedly friction-pulverizing said granulated core particle material and said added coating by applying a great pressure to said granulated core particle material and said added coating material and pushing said coating material against a surface of said granulated core particle material by pressing said granulated core particle material and said added coating material against said inner surface (4a) of said casing by forcing the pulverizing element against a layer of said granulated core particle material and said added coating material on said inner surface of said casing, and mixing said layer of said granulated core particle material and said added coating material relative to said inner surface of said casing by scraping the granulated core particle material and said added coating material off the inner surface of said casing by moving the scraping and mixing element along the inner surface of said casing in contact with the layer of material on said inner surface of said casing, and thereby coating the coating material onto the granulated core particle material, thereby obtaining a granulated tertiary material as a superconducting material.

10. The method of manufacturing a superconducting material as claimed in claim 1, wherein said coating material has a fusing point lower than a temperature range detrimental to the superconductivity of said granulated core particle material.

11. The method of manufacturing a superconducting material as claimed in claim 10, wherein said granulated core particle material contains component of Y and said coating material has a fusing point lower than 450 degrees in Celsius.

12. The method of manufacturing a superconducting material as claimed in claim 10, wherein said granulated core particle material contains component of Bi and said coating material has a fusing point lower than 800 degrees in Celsius.

* * * * *